(12) United States Patent
Terakawa et al.

(10) Patent No.: US 10,710,209 B2
(45) Date of Patent: Jul. 14, 2020

(54) WAFER POLISHING APPARATUS AND POLISHING HEAD USED FOR SAME

(71) Applicant: SUMCO CORPORATION, Tokyo (JP)

(72) Inventors: Ryoya Terakawa, Tokyo (JP); Ryuichi Tanimoto, Tokyo (JP); Hironori Kaneko, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 339 days.

(21) Appl. No.: 15/770,602

(22) PCT Filed: Oct. 12, 2016

(86) PCT No.: PCT/JP2016/080204
§ 371 (c)(1),
(2) Date: Apr. 24, 2018

(87) PCT Pub. No.: WO2017/073318
PCT Pub. Date: May 4, 2017

(65) Prior Publication Data
US 2018/0311783 A1    Nov. 1, 2018

(30) Foreign Application Priority Data
Oct. 30, 2015    (JP) ................................. 2015-214606

(51) Int. Cl.
*B24B 37/30*    (2012.01)
*B32B 3/08*    (2006.01)
*H01L 21/67*    (2006.01)

(52) U.S. Cl.
CPC .............. *B24B 37/30* (2013.01); *B32B 3/08* (2013.01); *H01L 21/67219* (2013.01)

(58) Field of Classification Search
CPC ...... B24B 37/30; B23B 3/08; H01L 21/67219
(Continued)

(56) References Cited

U.S. PATENT DOCUMENTS 5,584,746 A * 12/1996 Tanaka .................... B24B 37/30
451/288
5,624,299 A * 4/1997 Shendon ............... B24B 37/042
451/28

(Continued)

FOREIGN PATENT DOCUMENTS

JP    2003-25217    1/2003
JP    2005-79465    3/2005
(Continued)

OTHER PUBLICATIONS

International Search Report in International Patent Application No. PCT/JP2016/080204, dated Nov. 22, 2016.

*Primary Examiner* — George B Nguyen
(74) *Attorney, Agent, or Firm* — Greenblum & Bernstein, P.L.C.

(57) ABSTRACT

A wafer polishing apparatus is provided with a rotating platen to which a polishing pad is affixed and a polishing head that holds a wafer placed on the polishing pad while pressing the wafer. The polishing head has a membrane that contacts the upper surface of the wafer and applying a pressing force thereto and a support plate that supports the membrane. The membrane has a main surface part facing the bottom surface of the support plate and a side surface part facing the outer peripheral edge surface of the support plate. The vertical tension due to the side surface part of the membrane is larger than the lateral tension due to the main surface part of the membrane.

6 Claims, 4 Drawing Sheets

(58) Field of Classification Search
USPC .......................................................... 451/177
See application file for complete search history.

(56) References Cited

U.S. PATENT DOCUMENTS

| | | | | |
|---|---|---|---|---|
| 5,851,140 | A * | 12/1998 | Barns | B24B 37/32 451/288 |
| 6,227,955 | B1 * | 5/2001 | Custer | B24B 37/30 156/345.14 |
| 6,436,228 | B1 * | 8/2002 | Zuniga | B24B 37/32 451/285 |
| 6,508,696 | B1 * | 1/2003 | Kobayashi | B24B 37/30 451/286 |
| 6,890,249 | B1 * | 5/2005 | Zuniga | B24B 37/32 451/177 |
| 7,255,771 | B2 * | 8/2007 | Chen | B24B 37/30 156/345.12 |
| 8,859,070 | B2 * | 10/2014 | Yasuda | B32B 3/08 428/201 |
| 8,932,106 | B2 * | 1/2015 | Fukushima | B24B 37/015 451/288 |
| 2002/0173240 | A1 * | 11/2002 | Wang | B24B 37/30 451/41 |
| 2010/0311311 | A1 * | 12/2010 | Paik | B24B 37/30 451/41 |

FOREIGN PATENT DOCUMENTS

| | | |
|---|---|---|
| JP | 2007-12918 | 1/2007 |
| JP | 2007-50465 | 3/2007 |
| JP | 2013-111717 | 6/2013 |
| JP | 2015-71197 | 4/2015 |
| KR | 2010-0007649 A | 1/2010 |

* cited by examiner

WAFER POLISHING APPARATUS AND POLISHING HEAD USED FOR SAME

TECHNICAL FIELD

The present invention relates to a wafer polishing apparatus and a polishing head used for the same and, more particularly, to a membrane pressurization type polishing head and a wafer polishing apparatus using the polishing head.

BACKGROUND ART

Silicon wafers are widely used as a substrate material for semiconductor devices. The silicon wafers are manufactured by sequentially applying processes such as outer peripheral grinding, slicing, lapping, etching, double-side polishing, single-side polishing, washing, etc., to a silicon single crystal ingot. Among the above processes, the single-side polishing is a process required in order to remove unevenness or waviness on the wafer surface and thus to enhance flatness, in which mirror-finishing by CMP (Chemical Mechanical Polishing) method is performed.

Typically, in the single-side polishing process for a silicon wafer, a single wafer polishing apparatus (CMP apparatus) is used. The wafer polishing apparatus includes a rotating platen to which a polishing pad is affixed and a polishing head that holds a wafer on the polishing pad while pressing the wafer. The apparatus polishes one side of the wafer by rotating the rotating platen and polishing head while feeding slurry.

In order to enhance uniformity of the polishing amount in a wafer surface by uniformly pressing the entire surface of the wafer, a wafer polishing apparatus using a membrane pressurization type polishing head is used. For example, Patent Document 1 describes a wafer polishing apparatus having a membrane that transmits a pressing force to a wafer on the polishing pad and a tension adjusting means for adjusting tension of the membrane. Further, in order to make the polishing amount in a wafer surface uniform, Patent Document 2 describes a polishing head in which areas having different surface roughnesses are concentrically disposed on a wafer holding surface of a membrane (elastic body film). The areas include a first area formed from the outer periphery of the membrane to a section from 10% to 80% of the radius thereof and having an arithmetic-mean roughness Ra of 5.0 µm to 50.0 µm and a second area formed inside the first area having an arithmetic-mean roughness Ra of less than 5.0 µm. Further, Patent Document 3 describes a membrane for a polishing head having a circular bottom part, a wall part rising from the outer edge of the circular bottom part, an annular part extending from the upper end of the wall part to the central direction of a circle, and a projection part located at the terminal end of the annular part.

CITATION LIST

Patent Document

[Patent Document 1] Japanese Patent Application Laid-Open No. 2003-25217
[Patent Document 2] Japanese Patent Application Laid-Open No. 2007-12918
[Patent Document 3] Japanese Patent Application Laid-Open No. 2005-79465

SUMMARY OF THE INVENTION

Problem to be Solved by the Invention

In a conventional membrane pressurization type polishing head, the membrane is supported on a disk-shaped support plate. The diameter of the inside of the membrane is set equal to or slightly smaller than the diameter of the support plate, and the height of the inside of the membrane rubber is set equal to the height of the support plate. Such a membrane is subjected to air-pressurization to apply an elastic force to the pressing surface of the membrane facing the wafer, whereby the entire surface of the wafer is pressed uniformly.

However, in a case where the diameter of the inside of the membrane is smaller than the diameter of the support plate and the height of the inside of the membrane is substantially equal to the height of the support plate, a horizontal tension (a lateral tension) due to the main surface part of the membrane contacting the wafer is larger than a vertical tension due to the side surface part of the membrane, so that a variation occurs in an in-plane distribution of the pressing force by the membrane, which disadvantageously increases an in-plane variation of the polishing amount (machining allowance) of the wafer.

Means for Solving the Problem

The object of the present invention is therefore to provide a wafer polishing apparatus and a polishing head used therefor capable of enhancing uniformity of the polishing amount in the wafer surface.

To solve the above problem, a wafer polishing apparatus according to the present invention includes a rotating platen to which a polishing pad is affixed and a polishing head that holds a wafer placed on the polishing pad while pressing the wafer, wherein the polishing head has a membrane that contacts the upper surface of the wafer and applying a pressing force thereto and a support plate that supports the membrane, the membrane has a main surface part facing the bottom surface of the support plate and a side surface part facing the outer peripheral edge surface of the support plate, and the vertical tension due to the side surface part of the membrane is larger than the lateral tension due to the main surface part of the membrane.

A polishing head according to the present invention is a polishing head that holds a wafer placed on a rotating platen to which a polishing pad is affixed while pressing the wafer, the polishing head has a membrane that contacts the upper surface of the wafer and applies a pressing force thereto and a support plate that supports the membrane, wherein the membrane has a main surface part facing the bottom surface of the support plate and a side surface part facing the outer peripheral edge surface of the support plate, and the vertical tension due to the side surface part of the membrane is larger than the lateral tension due to the main surface part of the membrane.

According to the present invention, it is possible to prevent degrading of flatness around the corner part due to pulling of the corner part toward the main surface part by a lateral tension due to the main surface part of the membrane. This makes it possible to prevent slack of the membrane and to uniformize a pressure generated in the wafer pressing surface of the membrane, thereby enhancing uniformity of an in-plane distribution of a machining allowance of the wafer.

In the present invention, the dimensional ratio (Mh/Ph) of the height (Mh) of the inside of the side surface part of the membrane relative to the thickness (Ph) of the support plate is preferably larger than 0.75 and smaller than 1. Further, the dimensional ratio (Md/Pd) of the diameter (Md) of the inside of the main surface part of the membrane relative to the diameter (Pd) of the support plate is preferably larger than 0.95 and equal to or smaller than 1. When the dimensional ratio of the inner diameter of the membrane relative to the support plate falls within the above range, it is possible to suppress a variation in the wafer polishing amount due to slack of the membrane and to avoid a situation where the membrane cannot be attached to the support plate due to excessively small size of the membrane.

In the present invention, the membrane is preferably not divided into a plurality of pressurization zones that can be pressurization-controlled independently of each other but constitutes a single pressurization zone. Further, it is preferable that the polishing head further has a retainer ring that abuts against the outer peripheral edge surface of the wafer to restrict horizontal movement of the wafer and that the bottom surface of the retainer ring does not contact the surface of the polishing pad. The above-described effects of the present invention are large when the wafer polishing apparatus adopts so-called a single-zone pressurization type wafer pressurization mechanism or a non-grounded type retainer ring, thus further enhancing uniformity of the polishing amount in the wafer surface.

Advantageous Effects of the Invention

According to the present invention, there can be provided a wafer polishing apparatus and a polishing head used therefor capable of enhancing uniformity of the polishing amount in the wafer surface.

BRIEF DESCRIPTION OF DRAWINGS

FIG. 2A illustrates a state where the membrane 16 is attached to the support plate 15, FIG. 2B illustrates the membrane 16 alone, and FIG. 2C illustrates the support plate 15 alone;

DETAILED DESCRIPTION OF THE EMBODIMENTS

Preferred embodiments of the present invention will be described in detail below with reference to the accompanying drawings.

Figure 1:
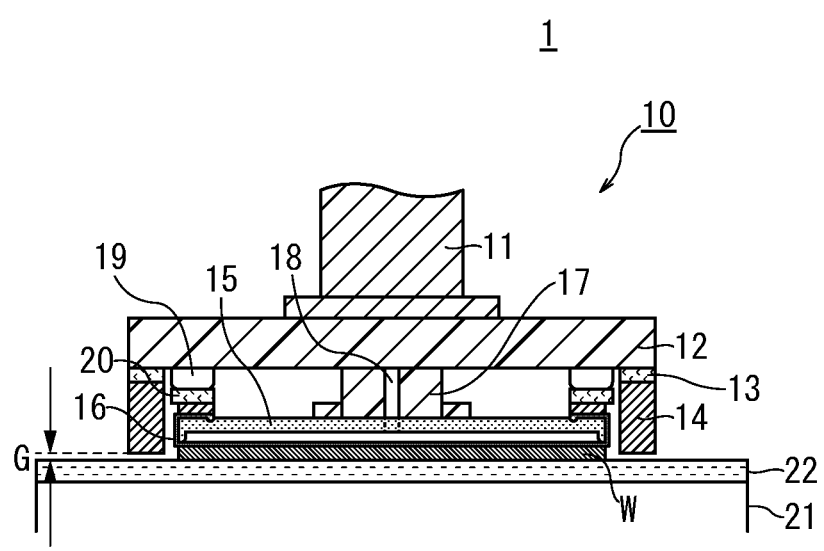
FIG. 1 is a cross-sectional side view schematically illustrating the configuration of a wafer polishing apparatus according to an embodiment of the present invention.

FIG. 1 is a cross-sectional side view schematically illustrating the configuration of a wafer polishing apparatus according to an embodiment of the present invention.

As illustrated in FIG. 1, a wafer polishing apparatus 1 has a rotating platen 21 to which a polishing pad 22 is affixed and a membrane pressurization type polishing head 10 that holds a wafer W placed on the polishing pad 22 while pressing the wafer W. By rotating the rotating platen 21 and wafer W held by the polishing head 10 while supplying slurry onto the polishing pad 22, one surface of the wafer W contacting the polishing pad 22 can be polished.

The polishing head 10 has an elevatably supported rotary shaft 11, a stainless pressurization flange 12 connected to the lower end of the rotary shaft 11, a retainer ring 14 attached to the bottom surface of the pressurization flange 12 through a height adjusting spacer 13, a support plate 15 attached to the pressurization flange 12, and a membrane 16 attached to the support plate 15. The support plate 15 is connected to the pressurization flange 12 through a drive transmission pin 17 and configured to be rotated together with the pressurization flange 12. The polishing head 10 further has a membrane pressurization line 18 for feeding air inside the membrane 16, a membrane height adjusting tube 19, and a membrane height adjusting spacer 20. The membrane 16 is pressed at its upper end by the membrane height adjusting spacer 20 for fixation thereof.

The retainer ring 14 is a guide member fixed to the bottom surface of the pressurization flange 12. During a polishing process, the bottom surface of the retainer ring 14 of the present embodiment does not contact the surface of the polishing pad 22 but a gap G having a predetermined width is kept therebetween. The retainer ring 14 is not a member that can be operated independently of the pressurization flange 12 like the membrane 16, so that even if the bottom surface of the retainer ring 14 is not pressed against the polishing pad 22, horizontal movement of the wafer W can be restricted by making the outer peripheral edge surface of the wafer W abut against the retainer ring 14, thereby making it possible to prevent the wafer from protruding to the outside of the polishing head 10.

The membrane 16 is a member having flexibility and is preferably made of EPDM (Ethylene Propylene Diene Rubber) or silicone rubber. The thickness of the membrane 16 is preferably in a range of 0.7 mm to 1.5 mm, and the rubber hardness thereof is preferably 30 degrees to 60 degrees (JIS K 6253 type A).

The main surface (bottom surface) of the membrane 16 has a circular planar shape matching with the size of the wafer W and contacts substantially the entire upper surface of the wafer W. The main surface of the membrane 16 constitutes a pressing surface pressing the upper surface of the wafer W, and the wafer W is subjected to air-pressurization through the membrane 16 to be pressed downward. A gap between the membrane 16 and the support plate 15 constitutes a sealed space, and air is fed to the sealed space through the membrane pressurization line 18, whereby tension to the membrane 16 can be applied and the elastic force of the pressing surface of the membrane 16 facing the wafer W can be enhanced.

The sealed space between the membrane 16 and the support plate 15 constitutes a single chamber without being separated into small compartments, so that the entire membrane 16 is expanded by the air fed through the membrane pressurization line 18, with the result that a uniform pressing force is applied to the upper surface of the wafer W contacting the membrane 16. That is, the wafer pressurization mechanism of the present embodiment using the membrane 16 does not adopt a multi-zone pressurization system having a plurality of pressurization zones that can be pressurization-controlled independently of each other, but adopts a single-zone pressurization system having a single pressurization zone. In the multi-zone pressurization system, the lateral tension of the membrane 16 less affects the in-plane distribution of the pressing force against the wafer W; while in the single-zone pressurization system, the lateral tension of the membrane 16 significantly affects the in-plane distribution of the pressing force against the wafer W, which may increase the in-plane variation of the polishing amount (machining allowance) of the wafer. This means that effects of the present invention are remarkable.

Figure 2A:
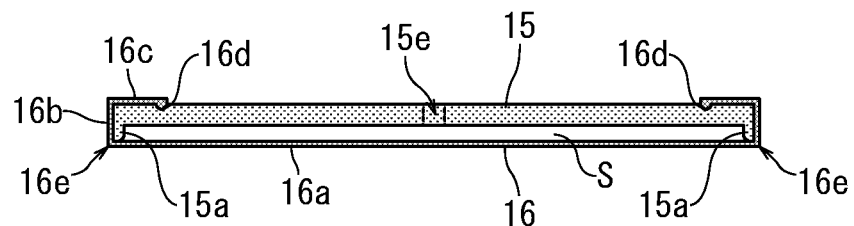
FIGS. 2A to 2C are each a cross-sectional side view illustrating the structures of the membrane and support plate.
Figure 2B:
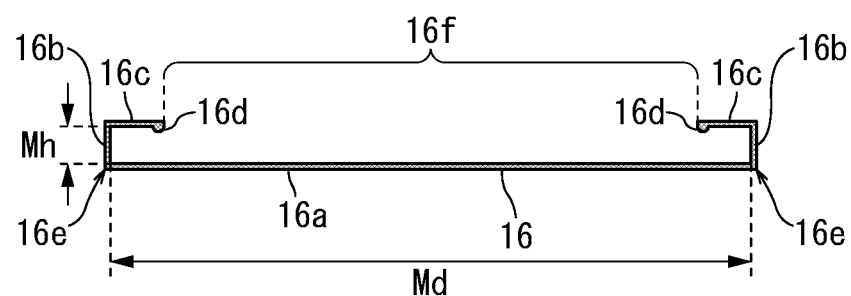
Figure 2C:
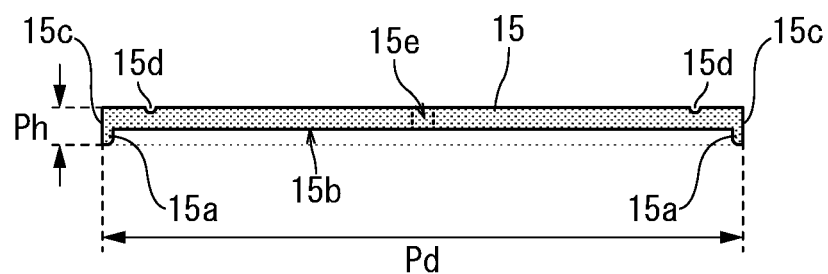

FIGS. 2A to 2C are each a cross-sectional side view illustrating the structures of the membrane 16 and support plate 15. FIG. 2A illustrates a state where the membrane 16 is attached to the support plate 15, FIG. 2B illustrates the membrane 16 alone, and FIG. 2C illustrates the support plate 15 alone.

As illustrated in FIGS. 2A to 2C, the membrane 16 has a circular main surface part 16a, a side surface part 16b bent upward at substantially right angles from the outer peripheral end of the circular main surface part 16a, and a ring-shaped upper surface part 16c bent radially inward substantially at right angles from the upper end of the side surface part 16b. The upper surface part 16c has a downward projection part 16d at its leading end. The main surface part 16a is apart facing a bottom surface 15b of the support plate 15, and the outside surface (bottom surface) thereof constitutes a pressing surface that contacts substantially the entire upper surface of the wafer W placed on the polishing pad 22 and presses the wafer W. The side surface part 16b of the membrane 16 is a part facing an outer peripheral edge surface 15c of the support plate 15.

An opening 16f is formed radially inside the ring-shaped upper surface part 16c. The diameter of the opening 16f is slightly smaller than the diameter of the support plate 15, so that the support plate 15 can be fitted into the inner frame of the membrane 16 through the opening 16f. That is, the membrane 16 is attached to the support plate 15 so as to cover the bottom surface of the support plate 15. Further, the ring-shaped upper surface part 16c of the membrane 16 is closely fitted to the upper surface of the support plate 15, and the ring-shaped projection part 16d is engaged with an engagement groove 15d formed on the upper surface of the support plate 15. Further, as illustrated in FIG. 1, the ring-shaped upper surface part 16c of the membrane 16 is pressed by the adjusting tube 19 and adjusting spacer 20, whereby the upper end of the side surface part 16b of the membrane 16 is fixed to the support plate 15.

A ring-shaped downward projection 15a is formed in the bottom surface 15b of the disk-shaped support plate 15 along the outer periphery of the bottom surface 15b. Thus, the main surface part 16a of the membrane 16 is not tightly fitted to the bottom surface of the support plate 15, but a gap S is formed between the membrane 16 and the support plate 15, allowing air to smoothly enter the membrane 16. The membrane pressurization line 18 communicates with a vent hole 15e penetrating the support plate 15, and the membrane is pressurized by the air fed into the sealed space from the vent hole 15e.

The inner size of the membrane 16 is equal to or smaller than the size of the support plate 15, so that the membrane 16 needs to be slightly stretched so as to be attached to the support plate 15 and, in this case, a lateral tension and a vertical tension occur, respectively, in the main surface part 16a and the side surface part 16b of the membrane 16 attached to the support plate 15.

The vertical tension due to the side surface part 16b of the membrane 16 needs to be larger than the lateral tension due to the main surface part 16a of the membrane 16. When the vertical tension is equal to or smaller than the lateral tension, a corner part 16e of the membrane 16 is pulled toward the center to degrade flatness around the outer periphery of the main surface part 16a, which makes it likely that a variation in the polishing amount occurs in the wafer outer peripheral portion. On the other hand, when the vertical tension of the membrane 16 is larger than the lateral tension thereof, the corner part 16e of the membrane 16 is pulled to the outer peripheral side to improve the flatness of the entire main surface part 16a including the vicinity of the outer periphery thereof, making it possible to uniformize the polishing amount in the wafer surface.

In the present embodiment, the dimensional ratio (vertical dimension ratio) of a height Mh of the inside (inner frame) of the membrane 16 relative to a thickness Ph of the support plate 15 is preferably equal to or larger than 0.75 and smaller than 1 ($0.75 \leq Mh/Ph < 1$). When the Mh/Ph is equal to or larger than 1, a variation in the wafer polishing amount in the peripheral direction is increased due to slack of the membrane; on the other hand, when the Mh/Ph is smaller than 0.75, the vertical tension becomes too large due to excessively small height dimension of the inside of the membrane 16, making it very difficult to attach the membrane 16 to the support plate 15.

The dimensional ratio (lateral dimension ratio) of a diameter Md of the inside (inner frame) of the membrane 16 relative to a diameter Pd of the support plate 15 is preferably equal to or larger than 0.95 and equal to or smaller than 1 ($0.95 \leq Md/Ph \leq 1$). When the Md/Pd is larger than 1, a variation in the wafer polishing amount in the radial direction is increased due to slack of the membrane; on the other hand, when the Md/Pd is smaller than 0.95, the lateral tension becomes too large due to excessively small diameter dimension of the inside of the membrane 16, making it very difficult to attach the membrane 16 to the support plate 15.

The following is apparent from the results obtained by simulating a stress distribution applied to the membrane 16 attached to the support plate 15. That is, for example, in a conventional membrane structure in which Mh/Ph is set to 0.99 and Md/Pd is to 0.99, a tensile stress concentrates on the corner part of the membrane 16, so that the surface of the main surface part around the corner part is significantly distorted to degrade uniformity of the wafer pressing force. On the other hand, in the membrane structure of the present invention in which Mh/Ph is set to 0.75 and Md/Pd is to 1.0, a tensile stress concentrates on the side surface part of the membrane 16 to reduce distortion of the surface of the main surface part around the corner part, thereby improving uniformity of the wafer pressing force.

As described above, the wafer polishing apparatus 1 according to the present invention has the membrane pressurization type polishing head 10, and the vertical tension due to the side surface part 16b of the membrane 16 is larger than the lateral tension due to the main surface part 16a of the membrane 16. With this configuration, it is possible to suppress slack of the main surface part 16a of the membrane 16 to thereby apply a uniform pressing force to the wafer W. Further, the dimensional ratio Mh/Ph of the height Mh of the inside of the membrane 16 relative to the thickness Ph of the support plate 15 is smaller than the dimensional ratio Md/Pd of the diameter Md of the inside of the membrane 16 relative to the diameter Pd of the support plate 15, so that it is possible to uniformize a pressure generated in the wafer pressing surface of the membrane. Thus, it is possible to prevent slack of the membrane 16 to thereby enhance uniformity of the polishing amount in the wafer surface.

While preferred embodiments of the present invention have been explained above, the present invention is not limited thereto. Various modifications can be made to the embodiments without departing from the scope of the present invention and it is needless to say that such modifications are also embraced within the scope of the invention.

For example, in the above embodiment, the retainer ring 14 of the polishing head 10 is fixed to the pressurization flange 12; however, the retainer ring 14 may be configured to be vertically movable independently of the pressurization flange 12 like the membrane 16.

Example

How the aspect ratio of the membrane relative to the support plate influences the in-plane distribution of the wafer polishing amount was evaluated. In this evaluation test, P-type silicon wafers with diameter of 450 mm and thickness of 925 μm, which were cut out from a silicon single crystal ingot with (100) crystal orientation grown by the Czochralski method and subjected to double-side polishing, were prepared, and a wafer polishing apparatus having a membrane pressurization type polishing head was used to apply mirror surface polishing to the wafers. In the polishing process, slurry having a silica concentration of 0.3 wt % and a silica particle diameter of 35 mm was used, and a polishing pad of a suede type was used. The rotation speed of the polishing head and rotating platen was set to 40 rpm, a membrane pressure was to 10 kpa, and a target polishing amount (machining allowance) was to 1 μm.

In the polishing process, a plurality of membrane samples having different aspect ratios were used to polish the wafer. The vertical dimensional ratio Mh/Ph of the membrane relative to the support plate was set to five values: 1.01, 1.0, 0.90, 0.8, and 0.75. The lateral dimensional ratio Md/Pd of the membrane relative to the support plate was set to four values: 1.01, 1.0, 0.98, and 0.95.

Thereafter, a wafer flatness measurement apparatus ("Nanometro 450TT" made by Kuroda Precision Industries Ltd.) was used to evaluate the in-plane variation of the polishing amount of each wafer. The results are illustrated in FIGS. 3 and 4.

Figure 3:
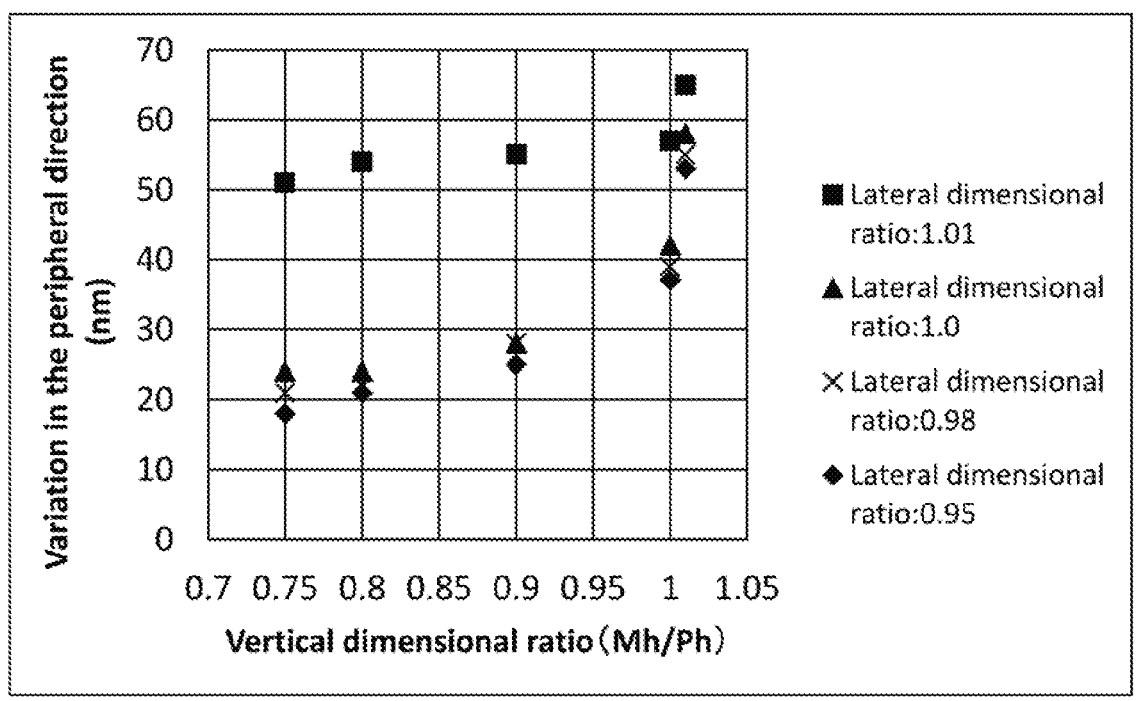
FIG. 3 is a graph illustrating the relationship between a change in the vertical dimensional ratio of the membrane 16 relative to the support plate 15 and a variation in the polishing amount of the wafer W in the peripheral direction.

FIG. 3 is a graph illustrating the relationship between a change in the vertical dimensional ratio of the membrane 16 relative to the support plate 15 and a variation in the polishing amount of the wafer W in the peripheral direction. The horizontal axis indicates the vertical dimensional ratio Mh/Ph, and the vertical axis indicates a variation (nm) in the thickness of the wafer in the peripheral direction. In the measurement of the thickness variation in the peripheral direction, the wafer was divided into eight sectors at 45° pitch, and an average profile in the machining allowance distribution of each sector at a 223 mm position from the wafer center was calculated. Then, a difference between the maximum and minimum values of the average profile was used as the thickness variation in the peripheral direction of the wafer.

As illustrated in FIG. 3, the variation in the wafer polishing amount in the peripheral direction when the vertical dimensional ratio of the membrane was 1.01 showed a large value that is equal to or more than 50 nm regardless of the lateral dimensional ratio of the membrane. Further, the variation in the wafer polishing amount in the peripheral direction when the lateral dimensional ratio of the membrane was 1.01 showed a large value that is equal to or more than 50 nm regardless of the vertical dimensional ratio of the membrane. On the other hand, the variation in the wafer polishing amount in the peripheral direction when the vertical dimensional ratio of the membrane was equal to or less than 1.0 was small except when the lateral dimensional ratio of the membrane was "1.01". Particularly it was found that the variation in the polishing amount tends to become smaller as the vertical dimensional ratio of the membrane becomes smaller.

Figure 4:
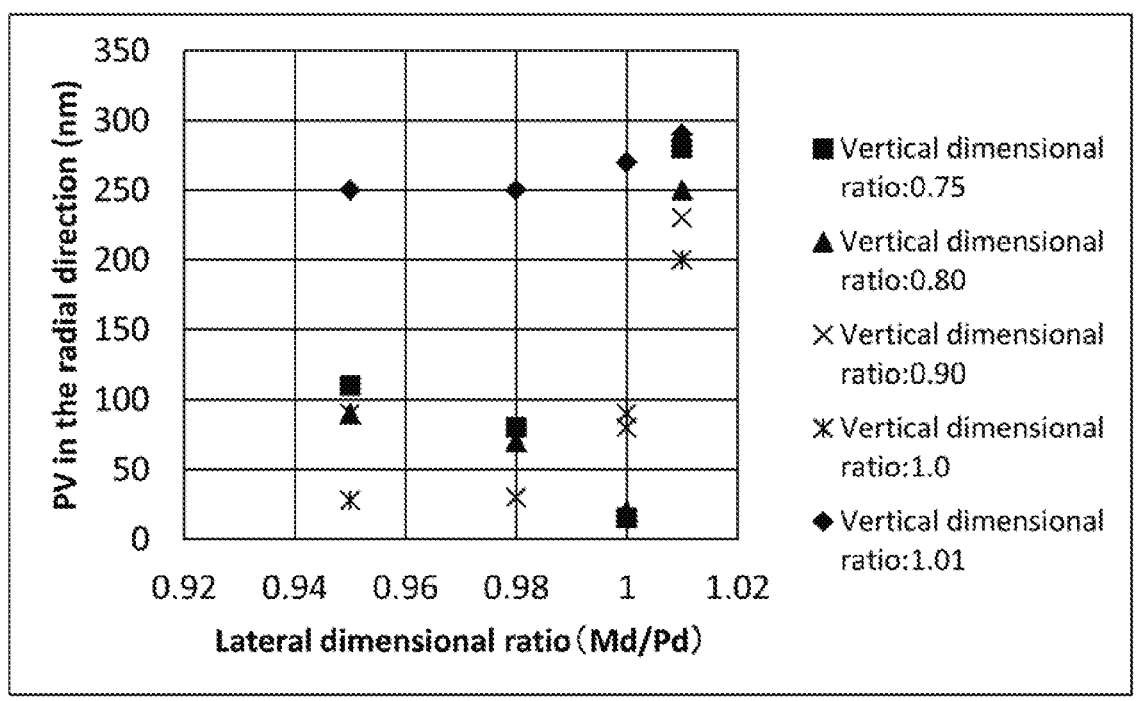
FIG. 4 is a graph illustrating the relationship between a change in the lateral dimensional ratio of the membrane 16 relative to the support plate 15 and a variation in the polishing amount of the wafer W in the radial direction.

FIG. 4 is a graph illustrating the relationship between a change in the lateral dimensional ratio of the membrane 16 relative to the support plate 15 and a variation in the polishing amount of the wafer W in the radial direction. The horizontal axis indicates the lateral dimensional ratio Md/Pd, and the vertical axis indicates a variation (nm) in the thickness of the wafer in the radial direction. As the variation in the polishing amount of the wafer in the radial direction, an average of differences between the maximum and minimum values of the variation in the radial direction of each sector was used.

As illustrated in FIG. 4, the variation in the wafer polishing amount in the radial direction when the lateral dimensional ratio of the membrane was 1.01 showed a large value that is equal to or more than 200 nm regardless of the vertical dimensional ratio of the membrane. Further, the variation in the wafer polishing amount in the radial direction when the vertical dimensional ratio of the membrane was 1.01 showed a large value that is equal to or more than 250 nm regardless of the lateral dimensional ratio of the membrane. On the other hand, the variation in the wafer polishing amount in the radial direction when the lateral dimensional ratio of the membrane was equal to or less than 1.0 was small except when the vertical dimensional ratio of the membrane was "1.01". Particularly it was found that the variation in the polishing amount tends to become smaller as the lateral dimensional ratio of the membrane becomes larger.

The above results reveal that when the vertical dimensional ratio Mh/Ph and lateral dimensional ratio Md/Pd of the membrane are within a range of 0.75 to 1.0 and within a range of 0.95 to 1.0, respectively, the variation in the polishing amount in the wafer surface can be suppressed to ensure satisfactory flatness. Further, when the vertical dimensional ratio Mh/Ph of the membrane relative to the support plate is smaller than the lateral dimensional ratio Md/Pd, uniformity of the polishing amount in the wafer surface can be further enhanced, and this effect becomes greater as a difference between the vertical dimensional ratio Mh/Ph and the lateral dimensional ratio Md/Pd increases.

REFERENCE SIGNS LIST 1 wafer polishing apparatus
10 polishing head
11 rotary shaft
12 pressurization flange
13 height adjusting spacer
14 retainer ring
15 support plate
15a projection of the support plate
15b bottom surface of the support plate
15c outer peripheral edge surface of the support plate
15d engagement groove of the support plate
15e vent hole of the support plate
16 membrane
16a main surface part of the membrane
16b side surface part of the membrane
16c upper surface part of the membrane
16d projection part of the membrane
16e corner part of the membrane 16f opening of the membrane
17 drive transmission pin
18 membrane pressurization line
19 membrane height adjusting tube
20 membrane height adjusting spacer
21 rotating platen
22 polishing pad
W wafer

What is claimed is:

1. A wafer polishing apparatus comprising:
a rotating platen to which a polishing pad is affixed; and
a polishing head that holds a wafer placed on the polishing pad while pressing the wafer, wherein
the polishing head has a membrane that contacts the upper surface of the wafer and applying a pressing force thereto and a support plate that supports the membrane,
the membrane has a main surface part facing the bottom surface of the support plate and a side surface part facing the outer peripheral edge surface of the support plate, and
the vertical tension due to the side surface part of the membrane is larger than the lateral tension due to the main surface part of the membrane.

2. The wafer polishing apparatus as claimed in claim 1, wherein the dimensional ratio (Mh/Ph) of the height (Mh) of the inside of the side surface part of the membrane relative to the thickness (Ph) of the support plate is equal to or larger than 0.75 and smaller than 1.

3. The wafer polishing apparatus as claimed in claim 1, wherein the dimensional ratio (Md/Pd) of the diameter (Md) of the inside of the main surface part of the membrane relative to the diameter (Pd) of the support plate is equal to or larger than 0.95 and equal to or smaller than 1.

4. The wafer polishing apparatus as claimed in claim 1, wherein the membrane constitutes a single pressurization zone without being divided into a plurality of pressurization zones that can be pressurization-controlled independently of each other.

5. The wafer polishing apparatus as claimed in claim 1, wherein
the polishing head further has a retainer ring that abuts against the outer peripheral edge surface of the wafer and restricts horizontal movement of the wafer, and
the bottom surface of the retainer ring does not contact the surface of the polishing pad.

6. A polishing head for a wafer polishing apparatus that holds a wafer placed on a rotating platen to which a polishing pad is affixed while pressing the wafer, comprising:
a membrane that contacts the upper surface of the wafer and applies a pressing force thereto; and
a support plate that supports the membrane, wherein
the membrane has a main surface part facing the bottom surface of the support plate and a side surface part facing the outer peripheral edge surface of the support plate, and
the vertical tension due to the side surface part of the membrane is larger than the lateral tension due to the main surface part of the membrane.

* * * * *